(12) United States Patent
Jakubowski et al.

(10) Patent No.: US 8,853,051 B2
(45) Date of Patent: Oct. 7, 2014

(54) METHODS OF RECESSING AN ACTIVE REGION AND STI STRUCTURES IN A COMMON ETCH PROCESS

(75) Inventors: Frank Jakubowski, Dresden (DE); Jorg Radecker, Dresden (DE); Frank Ludwig, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 13/445,596

(22) Filed: Apr. 12, 2012

(65) Prior Publication Data

US 2013/0273709 A1    Oct. 17, 2013

(51) Int. Cl.
   *H01L 21/76*     (2006.01)
(52) U.S. Cl.
   USPC ......................................................... 438/400
(58) Field of Classification Search
   CPC ................... H01L 21/76224; H01L 21/76229; H01L 21/2018; H01L 21/76232; H01L 21/76264
   USPC ................................. 438/142, 199–277, 400; 257/E27.061–E27.067, 288, 347–354, 257/365–366
   See application file for complete search history.

(56) References Cited

U.S. PATENT DOCUMENTS

| | | | |
|---|---|---|---|
| 7,547,610 B2 | 6/2009 | Schwan et al. | |
| 8,138,571 B2 | 3/2012 | Schwan et al. | |
| 2006/0046469 A1* | 3/2006 | Shim | 438/637 |
| 2008/0079086 A1* | 4/2008 | Jung et al. | 257/369 |
| 2010/0289094 A1* | 11/2010 | Reichel et al. | 257/409 |
| 2011/0049637 A1 | 3/2011 | Wiatr et al. | |
| 2011/0291292 A1 | 12/2011 | Frohberg et al. | |
| 2012/0156846 A1 | 6/2012 | Thees et al. | |

OTHER PUBLICATIONS

Title: Silicon Processing for the VLSI Era: vol. 1—Process Technology S. Wolf & R.N. Tauber, Second Edition, 2000 pp. 657-689.*
Dr. Alan Doolittle, Lecture 11: Etching Techniques Slides 1-12.*

* cited by examiner

*Primary Examiner* — Anthony Ho
(74) *Attorney, Agent, or Firm* — Amerson Law Firm, PLLC

(57) ABSTRACT

Generally, the present disclosure is directed to various methods of recessing an active region and an adjacent isolation structure in a common etch process. One illustrative method disclosed includes forming an isolation structure in a semiconducting substrate, wherein the isolation structure defines an active area in the substrate, forming a patterned masking layer above the substrate, wherein the patterned masking layer exposes the active area and at least a portion of the isolation structure for further processing, and performing a non-selective dry etching process on the exposed active area and the exposed portion of the isolation structure to define a recess in the substrate and to remove at least some of the exposed portions of the isolation structure.

18 Claims, 3 Drawing Sheets

METHODS OF RECESSING AN ACTIVE REGION AND STI STRUCTURES IN A COMMON ETCH PROCESS

BACKGROUND OF THE INVENTION

1. Field of the Invention

The present disclosure generally relates to the field of fabricating integrated circuits, and, more particularly, to various methods of recessing an active region and adjacent isolation structures in a common etch process.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit element used in manufacturing such integrated circuit devices. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region. These transistors are typically electrically separated by an isolation region, such as a shallow trench isolation (STI) region, that may be fabricated using known techniques.

Numerous processing operations are performed in a very detailed sequence, or process flow, to form such integrated circuit devices, e.g., deposition processes, etching processes, heating processes, masking operations, etc. One problem that arises with current processing techniques is that, after the STI regions are formed, at least portions of the STI regions are exposed to many subsequent etching or cleaning processes that tend to consume, at least to some degree, portions of the STI structures subjected to such etching processes. As a result, the STI structures may not perform their isolation function as intended, which may result in problems such as increased leakage currents, etc. Furthermore, since the erosion of the STI structures is not uniform across a die or a wafer, such structures may have differing heights, which can lead to problems in subsequent processing operations. For example, such height differences may lead to uneven surfaces on subsequently deposited layers of material, which may require additional polishing time in an attempt to planarize the surface of such layers. Such additional polishing may lead to the formation of additional particle defects, which may reduce device yields.

Additionally, a PFET transistor is typically provided with a so-called channel layer of epitaxial silicon/germanium to improve the performance of the PFET transistor. This channel layer of silicon/germanium is typically not present on an NFET transistor. Thus, it is common practice to perform an etching process to recess the P-active region of the substrate, while masking the N-active region of the substrate, such that, when the channel layer of epitaxial silicon/germanium is formed, the upper surface of the substrate in the N-active region will be approximately level with the upper surface of the channel layer of epitaxial silicon/germanium in the P-active region of the substrate.

Various techniques have been employed to attempt to minimize topography differences between PFET and NFET devices and adjacent isolation regions. In one technique, with the NFET masked with a photoresist mask, an initial isotropic wet etching process, using for example HF acid, is performed to reduce the thickness of the isolation structures adjacent the P-active region by about 10 nm or so. This wet etching process also removes some of the isolation material from under the photoresist mask due to the isotropic nature of the etching process. Thereafter, the photoresist mask is removed, and a layer of epitaxial silicon/germanium is formed selectively on the P-active region. A hard mask layer, such as a silicon dioxide hard mask, positioned on the N-active region prevents the formation of the silicon/germanium material on the N-active region during this process. The etch rate of the isolation material during this wet etching process also varies depending upon how close adjacent transistors are positioned relative to one another. In general, the etching rate of the isolation material is greater the more closely spaced are the transistors. The space-dependency variation in the etch rate of the isolation material can also lead to undesirable height differences in the various isolation structures formed in a substrate. Another problem associated with this technique is that the photoresist mask must be removed from above the N-active region prior to forming the epitaxial channel layer of silicon/germanium. That is why the hard mask layer is also positioned above the N-active region—to prevent the formation of silicon/germanium material on the N-active region. However, in the case where the silicon recess is performed in situ, the recessed silicon surface in the P-active region is not subjected to a general cleaning process, such as an HF cleaning process, for fear of removing the protective hard mask layer in the N-active region.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of recessing an active region and an adjacent isolation structure in a common etch process. One illustrative method disclosed includes forming an isolation structure in a semiconducting substrate, wherein the isolation structure defines an active area in the substrate, forming a patterned masking layer above the substrate, wherein the patterned masking layer exposes the active area and at least a portion of the isolation structure for further processing, and performing a non-selective dry etching process on the exposed active area and the exposed portion of the isolation structure to define a recess in the substrate and to remove at least some of the exposed portions of the isolation structure.

Another illustrative method includes forming at least one isolation structure in a semi-conducting substrate, wherein the at least one isolation structure defines a P-active area and an N-active area in the substrate, forming a hard mask layer above the N-active region, forming a patterned masking layer above the N-active region and the hard mask layer, wherein the patterned masking layer exposes the P-active area and at least a portion of the isolation structure positioned adjacent the P-active area for further processing, and performing a non-selective dry etching process on the exposed P-active area and the exposed portion of the isolation structure positioned adjacent the P-active area to define a recess in the substrate and to remove at least some of the isolation structure positioned adjacent the P-active area.

BRIEF DESCRIPTION OF THE DRAWINGS

The disclosure may be understood by reference to the following description taken in conjunction with the accompanying drawings, in which like reference numerals identify like elements, and in which.

Figure 1A:
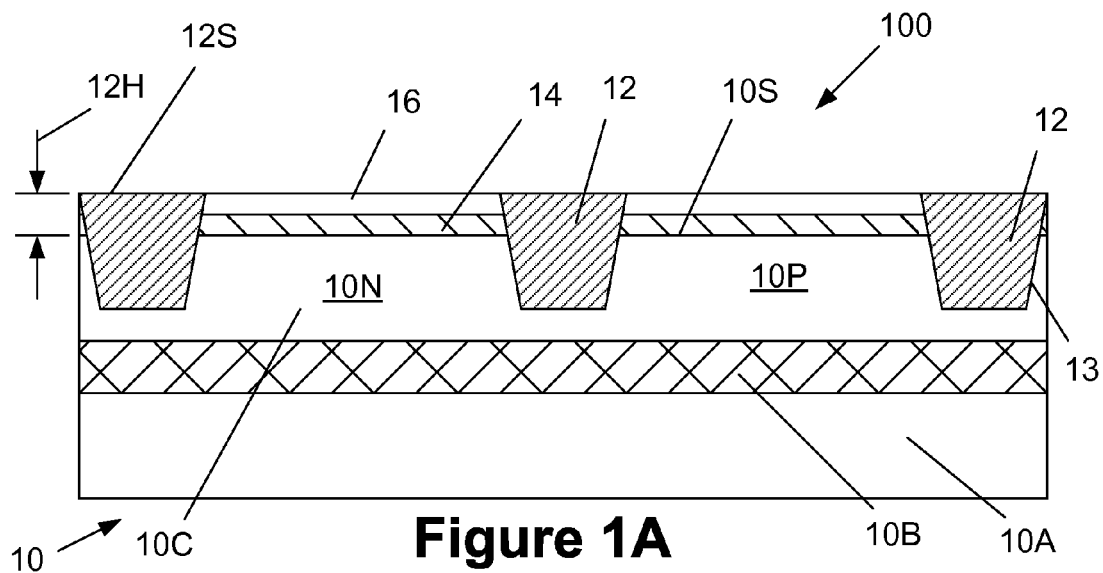
FIG. 1A-1G depict illustrative methods that may be employed as described herein to recess an active region and adjacent isolation structures in a common etch process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Moreover, the relative size of such features and structures may be exaggerated so as to facilitate explanation of the subject matter disclosed herein. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is generally related to various methods of recessing an active region and adjacent isolation structures in a common non-selective etch process. As will be readily apparent to those skilled in the art upon a complete reading of the present application, the methods disclosed herein are applicable to a variety of technologies, e.g., NMOS, PMOS, CMOS, etc., and they are readily applicable to a variety of devices, including, but not limited to, ASCIs, logic devices, memory devices, etc. With reference to the attached drawings, various illustrative embodiments of the methods disclosed herein will now be described in more detail.

As shown in FIG. 1A, an integrated circuit device 100 is depicted at an early stage of fabrication. The integrated circuit device 100 is formed in and above a semiconducting substrate 10. In one illustrative embodiment, the semiconducting substrate 10 is comprised of silicon. The substrate 10 may have a variety of configurations, such as the depicted silicon-on-insulator (SOI) structure having a bulk silicon layer 10A, a buried insulation layer 10B and an active layer 10C. The substrate 10 may also have a simple bulk silicon configuration.

The device 100, when completed, will include a plurality of NFET transistors and a plurality of PFET transistors formed in and above the semiconducting substrate 10. The illustrative transistors are not depicted in FIG. 1A. However, an NFET transistor will be formed in and above an illustrative N-active region 10N, and a PFET transistor will be formed in and above an illustrative P-active region 10P depicted in FIG. 1A. The N-active regions 10N and the P-active regions 10P across a die are typically separated by illustrative isolation structures 12, e.g., shallow trench isolation structures, formed in the substrate 10. The isolation structures 12 are intended to be illustrative in nature and they may be any of a variety of different isolation structures, including the illustrative shallow trench isolation (STI) structures 12 depicted in the drawings. Of course, after a complete reading of the present application, those skilled in the art will appreciate that the present disclosure is not limited to use with only the illustrative shallow trench isolation (STI) structures 12 depicted herein. Nevertheless, for ease of reference, the present subject matter will be disclosed by reference to the specific example of illustrative STI structures 12, although the present invention is not so limited.

Typically, during the formation of the PFET transistor, a layer of semiconductor material 24 (see FIG. 1G), e.g., silicon/germanium, is selectively formed on the active layer 10C in the P-active region 10P where the PFET transistor will be formed to enhance the performance of the PFET transistor. Typically, such a semiconductor layer 24 is not formed in the N-active region 10N where the NFET transistor will be formed. In general, given the differences in the structure of the NFET transistors and the PFET transistors, and different techniques that are used in an attempt to enhance the performance of the NFET transistors and the PFET transistors, the active regions 10N, 10P and the adjacent isolation structures 12 are subject to different processing operations. For example, prior to selectively forming the layer of semiconductor material 24 for the PFET transistor in only the P-active region 10P, one or more etching and masking processes may be performed only on the P-active region 10P. The differing process operations to which the STI structures 12 are subjected may cause varying erosion of the STI structures 12.

In FIG. 1A, the device 100 is depicted at the point of fabrication where an illustrative pad oxide layer 14 and a pad nitride layer 16 were deposited above the substrate 10 and patterned using traditional photolithography and etching processes. Thereafter, trenches 13 for the STI structures 12 were formed in the active layer 10C using the patterned pad oxide layer 14 and the pad nitride layer 16 as an etch mask. Thereafter, a deposition process was performed with, for example, silicon dioxide to overfill the trenches 13 formed in the active layer 10C. A chemical mechanical polishing (CMP) process was then performed to remove excess STI material, like silicon dioxide, from above the surface of the pad nitride layer 16. Then, a subsequent deglazing (etching) process was performed to insure that all of the silicon dioxide material is cleared from the upper surface of the pad nitride layer 16.

Typically, the upper surface 12S of the STI structures 12 will be set to be some desired height 12H above the surface 10S of the active layer 10C. The height 12H will vary depending upon the application, but, in one illustrative example, the height 12H may be on the order of about 20-30 nm to accommodate loss of the STI material in subsequent processing operations. Please note that the size of the STI structures 12 relative to other structures or layers depicted in the drawings is not to scale. The various features, and their relative sizes, have been enlarged herein so as to facilitate explanation of the present invention.

Figure 1B:
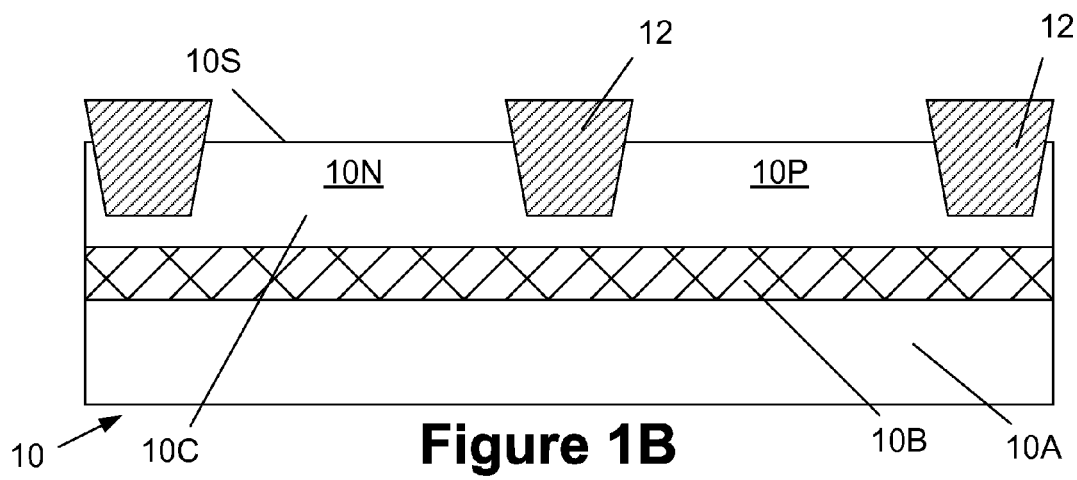

FIG. 1B depicts the device after the pad nitride layer 16 and the pad oxide layer 14 have been removed by performing one or more etching processes. During these etching processes, the STI structures 12 are subject to some erosion (depending upon the selectivity of the etching process), but the erosion tends to be uniform in nature as all of the STI structures 12 are subjected to this etching process.

Figure 1C:
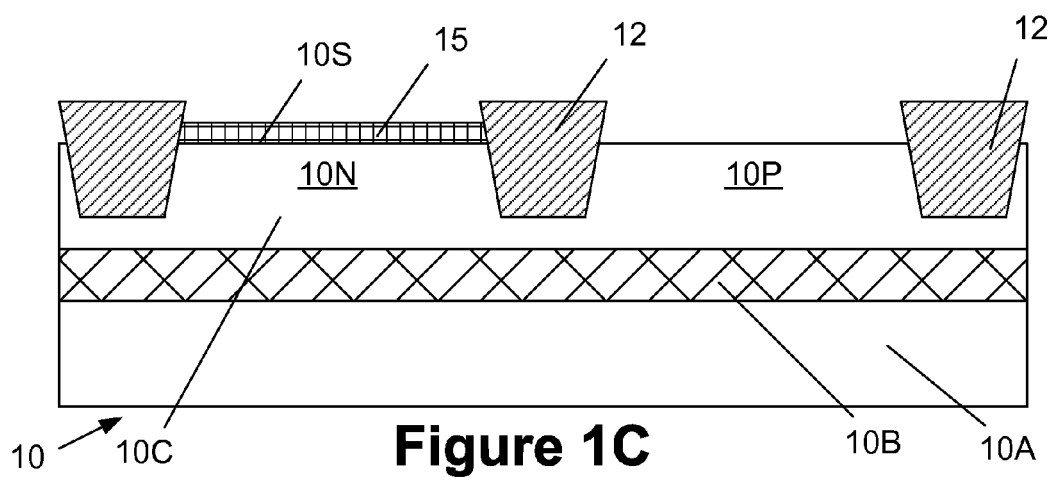

Thereafter, as shown in FIG. 1C, in one illustrative embodiment, a hard mask layer 15 is selectively formed on the N-active region 10N. The hard mask layer 15 may be comprised of a variety of different materials, such as, for example, silicon dioxide, silicon nitride, etc., and it may be formed using a variety of techniques. In one illustrative example, the hard mask layer may be a layer of silicon dioxide having a thickness of about 6-10 nm that is formed by performing a thermal growth process while masking the P-active region 10P. In some cases, the hard mask layer 15 may actually be the pad oxide layer 14. The pad oxide layer 14 may be left in place over the N-active region 10N by forming an appropriate masking layer during the etching process performed to remove the pad oxide layer 14.

Figure 1D:
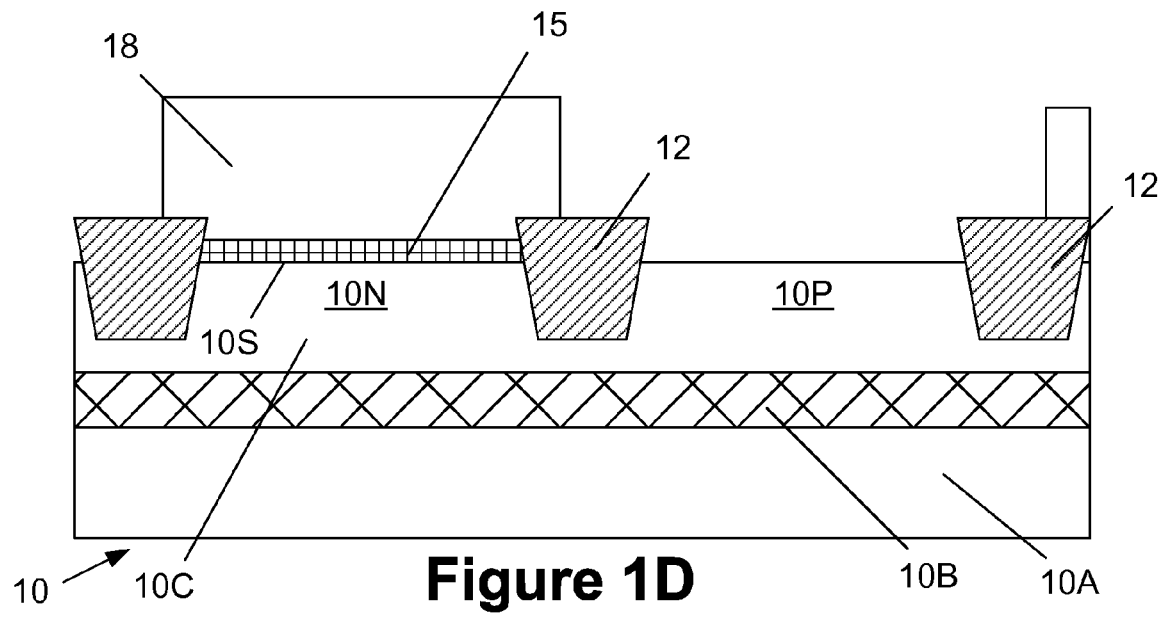

Next, as shown in FIG. 1D, a masking layer 18 is formed over the N-active region 10N which exposes the P-active region 10P for further processing. The masking layer 18 may be comprised of, for example, photoresist.

Figure 1E:
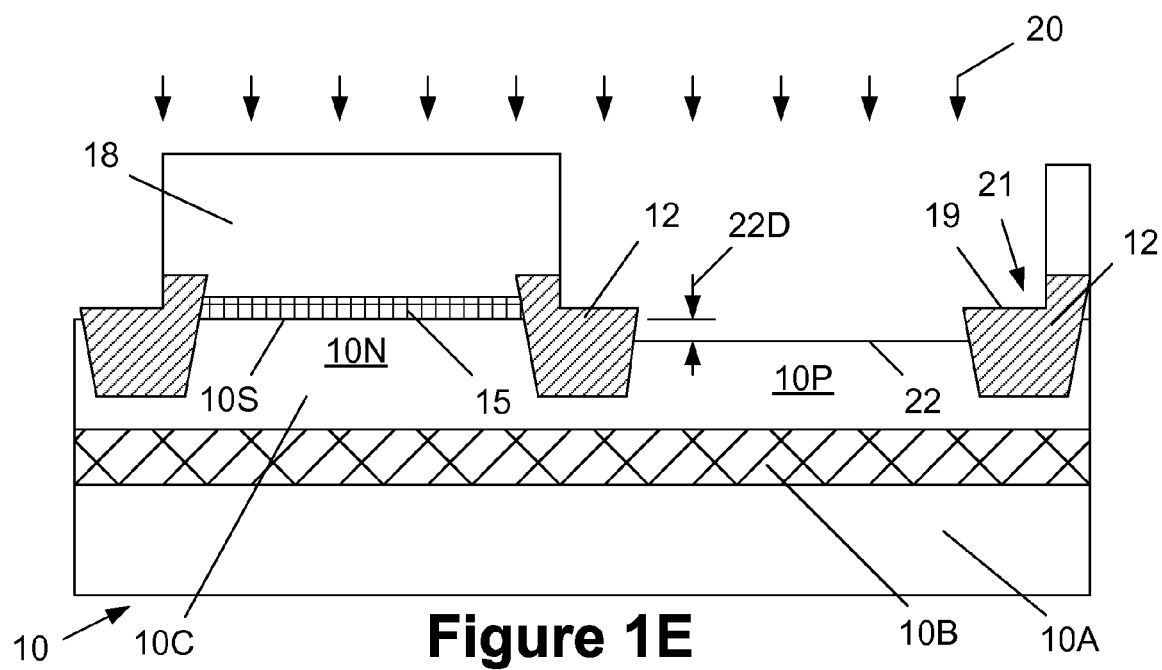

Then, as shown in FIG. 1E, a non-selective dry etching process 20, such as a reactive ion etching process using $CF_4$ or Argon or a mixture of both, is performed on the exposed P-active region 10P and the exposed portions of the adjacent isolation structures 12. The etching process 20 results in the definition of a recess 22 in the P-active region 10P. The depth 22D of this recess may vary depending upon the particular application. In one illustrative embodiment, the depth 22D of the recess 22 may be about 2-10 nm. The etching process 20 also consumes the exposed parts of the isolation structures 12, as reflected in FIG. 1E, and defines a recess 21 in the STI structures 12 that has a substantially planar, substantially horizontal bottom surface 19. Importantly, since the etching process 20 is non-selective in nature, the STI structures 12 tend to have an area with a relatively flat surface 19 as opposed to an uneven or slanted surface when selective etching processes are employed to define the recess 22. Although the etching process 20 is non-selective as between the substrate 10 and the isolation structures 12, the isolation structures 12 may etch at a slower rate than does the silicon substrate 10. Another point to note is that the dry etching process 20, unlike the wet etching process described in the background section of this application, does not tend to exhibit etch rate variations based upon the spacing between adjacent transistors. Thus, more across substrate uniformity may be obtained using the etching process 20 and the novel methods described herein.

Figure 1F:
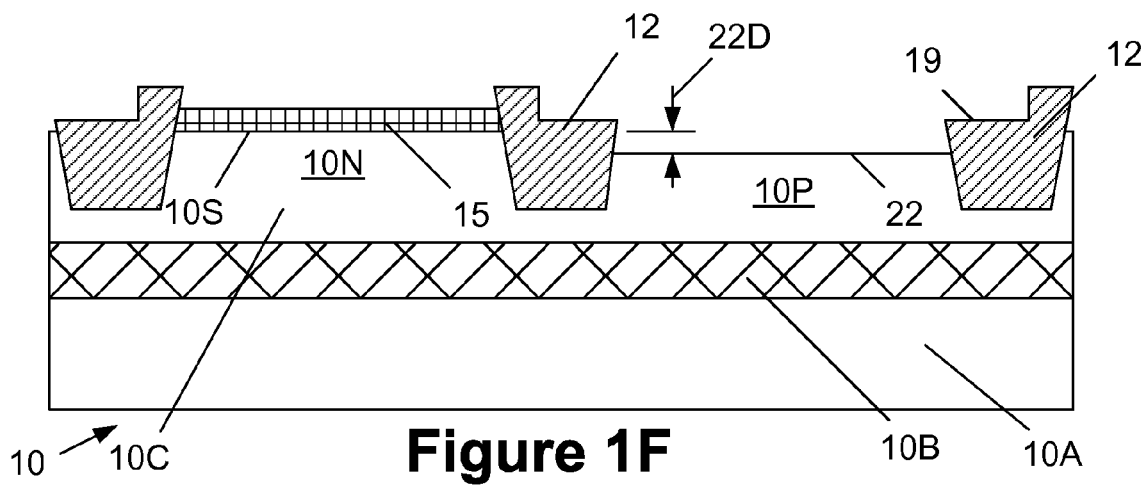

Next, as shown in FIG. 1F, the masking layer 18 is removed using traditional techniques, such as ashing. In one illustrative embodiment, the process performed to remove the masking layer 18 is performed in situ in the same process chamber where the etching process 20 was performed. Thereafter, the device 100 is subjected to a wet cleaning process with, for example, a dilute HF acid to insure that the surface of the recess 22 is clean prior to depositing an epitaxial silicon/germanium material in the recess 22. This wet cleaning process may also attack the isolation structures 12 and the hard mask layer 15. The hard mask layer 15 is typically formed to such a thickness that, even after this HF cleaning process is performed, sufficient portions of the hard mask layer 15 remain in place to protect the N-active region 10N in the subsequent epitaxial growth process that will be performed to form the channel layer of epitaxial silicon/germanium in the recess 22 in the P-active region 10P.

Figure 1G:
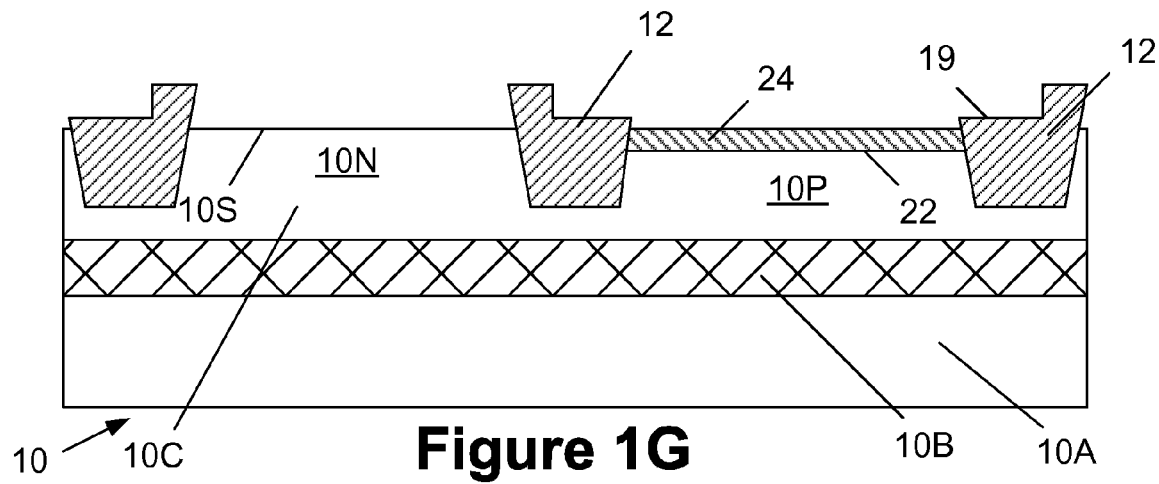

Next, as shown in FIG. 1G, a layer of semiconductor material 24 is formed in the recess 22 in the P-active region 10P. In one illustrative embodiment, the layer of semiconductor material 24 is a layer of silicon/germanium having a thickness of about 5-10 nm that is formed by performing an epitaxial deposition process. Then, a cleaning process with, for example, HF acid, is performed to remove the hard mask layer 15 from above the N-active region 10N. At this point of the process, fabrication of the NFET and PFET transistors may proceed as normal. For example, various process operations may be performed to form gate structures (polysilicon gates or metal gates) using gate-first or gate-last techniques, sidewall spacers may be formed, source/drain regions may be formed in the substrate 10 by performing known ion implantation processes, and various metallization layers may be formed above the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. It should also be understood that reference to the surfaces as "upper surfaces" is only intended to convey the relative position of those surfaces relative to the surface of the substrate, and it is not intended to describe the absolute position of those surfaces relative to ground. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an isolation structure in a semiconducting substrate, said isolation structure defining an active area in said substrate;
    forming a patterned masking layer above said substrate, said patterned masking layer exposing said active area and at least a portion of said isolation structure for further processing; and
    performing a non-selective dry etching process on said exposed active area and said exposed portion of said isolation structure to define a recess in said substrate and to remove at least some of said exposed portions of said isolation structure.

2. The method of claim 1, wherein said active area is a P-active area.

3. The method of claim 1, wherein said isolation structure is a shallow trench isolation structure.

4. The method of claim 1, wherein performing said non-selective dry etching process defines a recess in said isolation structure having a substantially planar, horizontal bottom surface.

5. The method of claim 1, wherein performing said non-selective dry etching process comprises performing a reactive ion etching process using CF4 or argon or a mixture thereof as the etchant gas.

6. The method of claim 1, further comprising:
removing said masking layer; and
forming a layer of semiconductor material in said recess in said substrate.

7. The method of claim 1, wherein, prior to performing said non-selective dry etching process on said exposed active area, an upper surface of said exposed active area is recessed relative to an upper surface of said isolation structure defining said active area.

8. A method, comprising:
forming at least one isolation structure in a semiconducting substrate, said at least one isolation structure defining a P-active area and an N-active area in said substrate;
forming a hard mask layer above said N-active area;
forming a patterned masking layer above said N-active area and said hard mask layer, said patterned masking layer exposing said P-active area and at least a portion of said at least one isolation structure positioned adjacent said P-active area for further processing; and
performing a non-selective dry etching process on said exposed P-active area and said exposed portion of said at least one isolation structure positioned adjacent said P-active area to define a recess in said substrate and to remove at least some of said at least one isolation structure positioned adjacent said P-active area.

9. The method of claim 8, wherein performing said non-selective dry etching process defines a recess in said at least one isolation structure positioned adjacent said P active area having a substantially planar, horizontal bottom surface.

10. The method of claim 8, further comprising:
removing said masking layer to thereby expose said hard mask layer; and
forming a layer of semiconductor material in said recess in said substrate while said hard mask layer remains positioned above said N-active area.

11. The method of claim 10, wherein said semiconductor material is comprised of silicon/germanium.

12. The method of claim 8, wherein said hard mask layer covers an entirety of an upper surface of said N-active area and exposes an entirety of an upper surface of said isolation structure defining said N-active area.

13. The method of claim 8, wherein, prior to performing said non-selective dry etching process on said exposed P-active area, an upper surface of said exposed P-active area is recessed relative to an upper surface of said at least one isolation structure defining said P-active area.

14. A method, comprising:
forming at least one isolation structure comprised of silicon dioxide in a semiconducting substrate, said at least one isolation structure defining a P-active area and an N-active area in said substrate;
forming a hard mask layer comprised of silicon dioxide above said N-active area;
forming a patterned photoresist masking layer above said N-active area and said hard mask layer, said patterned photoresist masking layer exposing said P-active area and at least a portion of said at least one isolation structure positioned adjacent said P-active area for further processing;
performing a non-selective dry reactive ion etching process on said exposed P-active area and said exposed portion of said at least one isolation structure positioned adjacent said P-active area to define a recess in said substrate and to define a recess in said at least one isolation structure positioned adjacent said P-active area having a substantially planar, horizontal bottom surface;
removing said masking layer to thereby expose said hard mask layer; and
forming a layer of silicon/germanium in said recess in said substrate while said hard mask layer remains positioned above said N-active area.

15. The method of claim 14, wherein said hard mask layer covers an entirety of an upper surface of said N-active area and exposes an entirety of an upper surface of said at least one isolation structure defining said N-active area.

16. The method of claim 15, wherein said upper surface of said N-active area is recessed below said upper surface of said at least one isolation structure defining said N-active area.

17. The method of claim 14, wherein, prior to forming said hard mask layer, an upper surface of said N-active area is recessed relative to an upper surface of said at least one isolation structure defining said N-active area.

18. The method of claim 14, wherein, prior to performing said non-selective dry reactive ion etching process on said exposed P-active area, an upper surface of said exposed P-active area is recessed relative to an upper surface of said at least one isolation structure defining said P-active area.

* * * * *